(12) United States Patent
Park et al.

(10) Patent No.: US 12,484,153 B2
(45) Date of Patent: Nov. 25, 2025

(54) ELECTRONIC COMPONENT MODULE AND POWER SUPPLY DEVICE COMPRISING SAME

(71) Applicant: LG INNOTEK CO., LTD., Seoul (KR)

(72) Inventors: Sung June Park, Seoul (KR); Soo San Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 235 days.

(21) Appl. No.: 18/269,375

(22) PCT Filed: Jan. 4, 2022

(86) PCT No.: PCT/KR2022/000108
§ 371 (c)(1),
(2) Date: Jun. 23, 2023

(87) PCT Pub. No.: WO2022/149835
PCT Pub. Date: Jul. 14, 2022

(65) Prior Publication Data
US 2024/0090132 A1   Mar. 14, 2024

(30) Foreign Application Priority Data

Jan. 5, 2021  (KR) .......................... 10-2021-0001039

(51) Int. Cl.
*H05K 1/18*        (2006.01)
*H01F 27/24*       (2006.01)
(Continued)

(52) U.S. Cl.
CPC ............ *H05K 1/181* (2013.01); *H01F 27/24* (2013.01); *H01F 27/28* (2013.01); *H01F 27/292* (2013.01);
(Continued)

(58) Field of Classification Search
CPC ............ H05K 1/14; H05K 1/145; H05K 1/18; H05K 1/181; H05K 3/63; H05K 3/68;
(Continued)

(56) References Cited

U.S. PATENT DOCUMENTS 4,661,792 A * 4/1987 Watkins ................ H01F 27/027
336/198
6,665,183 B1   12/2003 Shikata et al.
(Continued)

FOREIGN PATENT DOCUMENTS

CN        205142021     4/2016
JP        S4892434      11/1973
(Continued)

OTHER PUBLICATIONS

International Search Report dated Apr. 15, 2022 issued in Application No. PCT/KR2022/000108.
(Continued)

*Primary Examiner* — Tuan T Dinh
(74) *Attorney, Agent, or Firm* — KED & ASSOCIATES, LLP

(57) ABSTRACT

An electronic component module comprises: a first printed circuit board; a transformer which is disposed on the first printed circuit board and includes a core and a first coil disposed within the core; a second printed circuit board which is disposed on the transformer; a busbar which is disposed outside the core and to which the opposite ends of the first coil are coupled; and a bracket which is disposed outside the busbar and coupled to the core.

16 Claims, 12 Drawing Sheets

(51) Int. Cl.
*H01F 27/28* (2006.01)
*H01F 27/29* (2006.01)
*H05K 1/14* (2006.01)

(52) U.S. Cl.
CPC ..... *H05K 1/141* (2013.01); *H05K 2201/1003* (2013.01); *H05K 2201/10272* (2013.01)

(58) Field of Classification Search
CPC ....... H02M 3/003; H02M 7/003; H01F 27/02; H01F 27/06; H01F 27/24; H01F 27/26–29; H01F 27/363; H01F 27/366; H01F 27/369
USPC ........................ 361/770–774, 782–784, 790; 336/192–200
See application file for complete search history.

(56) References Cited

U.S. PATENT DOCUMENTS

| | | | | |
|---|---|---|---|---|
| 8,498,124 B1 * | 7/2013 | Folker | ...................... | H01F 27/06 361/740 |
| 8,897,029 B2 * | 11/2014 | Kippley | ................ | H02M 3/003 361/740 |
| 8,923,010 B2 * | 12/2014 | Parish | ................... | H05K 1/145 361/752 |
| 9,148,066 B2 * | 9/2015 | Chen | ...................... | H02M 3/003 |
| 10,070,543 B2 * | 9/2018 | Sung | ...................... | H01R 12/724 |
| 10,879,705 B2 * | 12/2020 | Singh | ................... | H05K 9/0081 |
| 12,063,741 B2 * | 8/2024 | Yu | ........................ | H02M 3/003 |
| 2013/0077276 A1 | 3/2013 | Kippley et al. | | |
| 2015/0293146 A1 * | 10/2015 | Khoshnood | .............. | G01R 1/22 324/756.01 |
| 2020/0194159 A1 | 6/2020 | Tsuchida et al. | | |

FOREIGN PATENT DOCUMENTS

| | | |
|---|---|---|
| JP | H0634215 | 5/1994 |
| JP | H06132129 | 5/1994 |
| JP | 2003244958 | 8/2003 |
| JP | 2009218292 | 9/2009 |
| JP | 2017-093145 | 5/2017 |
| KR | 10-2003-0069117 | 8/2003 |
| KR | 10-1675401 | 11/2016 |
| KR | 10-2018-0018437 | 2/2018 |
| KR | 10-2019-0085389 | 7/2019 |

OTHER PUBLICATIONS

European Search Report dated Mar. 6, 2025 issued in Application No. 22736812.3.
Korean Office Action dated Jun. 13, 2025, issued in Application No. 10-2021-0001039.
Japanese Office Action dated Sep. 2, 2025, issued in Application No. 2023-540853.

* cited by examiner ered to be implemented as miniaturized prod-

ELECTRONIC COMPONENT MODULE AND POWER SUPPLY DEVICE COMPRISING SAME

CROSS-REFERENCE TO RELATED PATENT APPLICATIONS

This application is a U.S. National Stage Application under 35 U.S.C. § 371 of PCT Application No. PCT/KR2022/000108, filed Jan. 4, 2022, which claims priority to Korean Patent Application No. 10-2021-0001039, filed Jan. 5, 2021, whose entire disclosures are hereby incorporated by reference.

TECHNICAL FIELD

The present embodiment relates to an electronic component module and a power supply device comprising the same.

BACKGROUND ART

Recently, power electronics technology requires high power and high power density. For high power, devices for higher power must be selectively configured to increase efficiency while being implemented as miniaturized products with less heat generation loss.

In addition, each device should be disposed to maximize spatial efficiency, and at the same time, matters such as insulation distance and power path between components should be considered, and in particular, vibration and cooling performance are important design factors and should be optimized to implement high power density.

The outer appearance of the power supply device being used in electronic equipment or data centers is formed by a housing, and a number of electronic components for operation are disposed inside the housing. The electronic component may include a transformer for voltage conversion and an inductor for obtaining inductance, and may be disposed on a printed circuit board to form a module.

DETAILED DESCRIPTION OF THE INVENTION

Technical Subject

An objective of the present embodiment is to provide an electronic component module and a power supply device comprising the same that can increase heat dissipation and power efficiency and miniaturized by improving the fastening structure between components.

Technical Solution

An electronic component module according to the present embodiment comprises: a first printed circuit board; a transformer being disposed on the first printed circuit board and including a core and a first coil being disposed inside the core; a second printed circuit board being disposed on the transformer; a busbar being disposed outside the core and coupled to both ends of the first coil; and a bracket being disposed outside the busbar and coupled to the core.

The first coil includes a first end portion and a second end portion, and the busbar may include a first busbar being coupled to the first end portion and a second busbar being coupled to the second end portion.

The first busbar includes: a first phase end portion including a first coupling hole to which the first end portion is coupled; a first lower end portion being coupled to the first printed circuit board; and a first connection portion connecting the first upper end portion and the first lower end portion, wherein the second busbar includes: a second upper end portion including a second coupling hole to which the second end portion is coupled; a second lower end portion being coupled to the first printed circuit board; and a second connection portion connecting the second upper end portion and the second lower end portion, and wherein the second connection portion may have a region bent at least once.

The distance between the first upper end portion and the second upper end portion may be longer than a distance between the first lower end portion and the second lower end portion.

The bracket includes: an upper surface portion disposed above the core; a lower surface portion of the core is disposed; and a side surface portion being disposed on a side surface of the core, wherein a first through hole and a second through hole may be disposed in the side surface portion to allow the first upper end portion and the second upper end portion to penetrate therethrough.

A third through hole and a fourth through hole penetrating an inner surface from an outer surface may be disposed on the side surface portion, corresponding to the disposed regions of the first side surface portion and the second side surface portion.

A first protruded portion being protruded more upward than the other regions is disposed on an upper surface of the core, and a second protruded portion being protruded more downward than the other regions is disposed on a lower surface of the core, and the upper surface portion and the lower surface portion may be respectively hook-coupled to the first protruded portion and the second protruded portion.

At a lower end of the side surface portion, a first guide groove, being formed to be more recessed than other regions, to which the first lower end portion is coupled, and a second guide groove to which the second lower end portion is coupled may be disposed The side surface portion may include at least one or more exposure hole exposing a side surface of the core to the outside.

A power supply device according to the present embodiment comprises: a housing; and an electronic component module being disposed inside the housing, wherein the electronic component module comprises: a first printed circuit board; a transformer being disposed on the first printed circuit board and including a core and a first coil being disposed inside the core; a second printed circuit board being disposed on the transformer; a busbar being disposed outside the core and coupled to both ends of the first coil; and a bracket being disposed outside the busbar and coupled to the core.

Advantageous Effects

According to the present embodiment, there are advantages in that the first coil and the first printed circuit board can be easily coupled through the busbar, and the busbar can be compactly coupled to the outer surface of the transformer through the bracket.

In addition, since the inductor forms a coupling structure with a plurality of printed circuit boards through a single busbar being disposed only at a lower portion, there is an advantage in that a wide space inside the housing can be secured.

In addition, there is an advantage in that the volume ratio of the coil inside the core can be increased because the arrangement region of the core can be largely secured due to the omission of the busbar being disposed in a horizontal direction of the core.

In addition, since it is possible to insulate between pluralities of printed circuit boards being disposed adjacent to each other through the supporter, there is an advantage in securing a wider space for component arrangement on a main printed circuit board.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
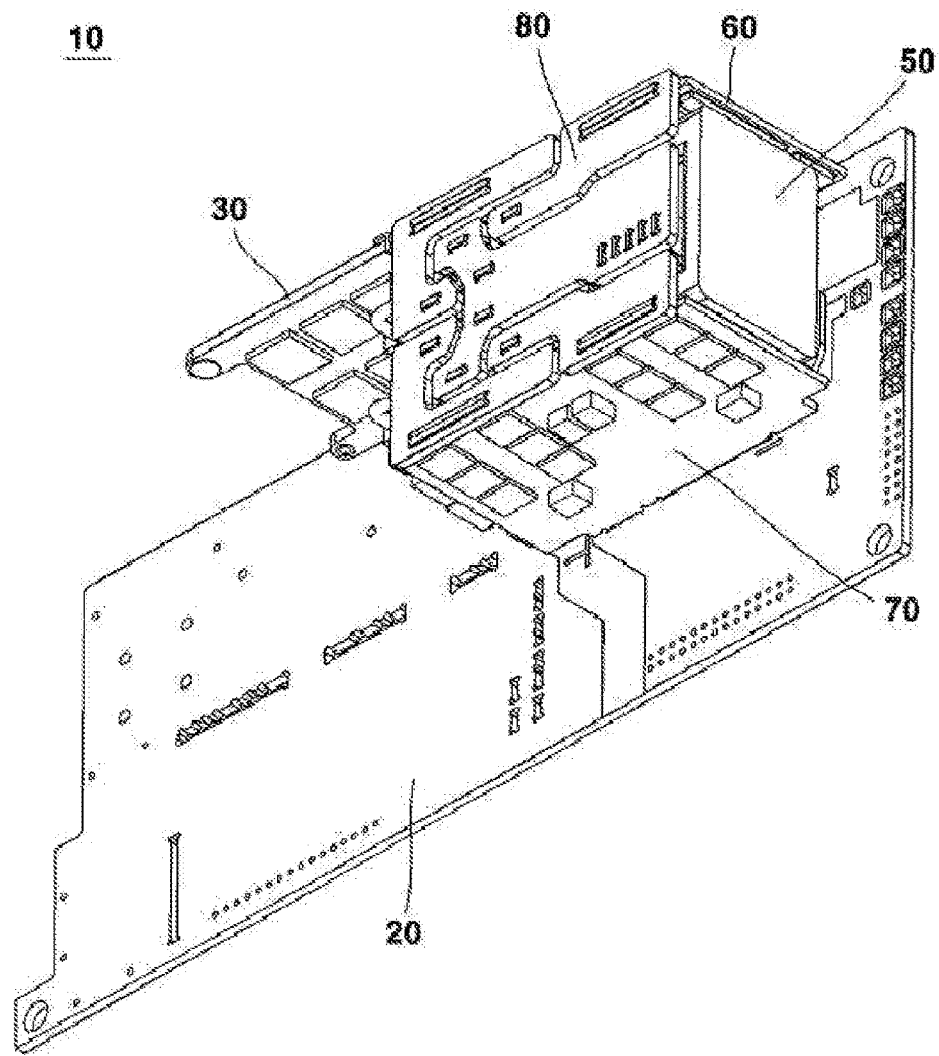
FIG. 1 is a perspective view of an electronic component module in a power supply device according to an embodiment of the present invention.
Figure 2:
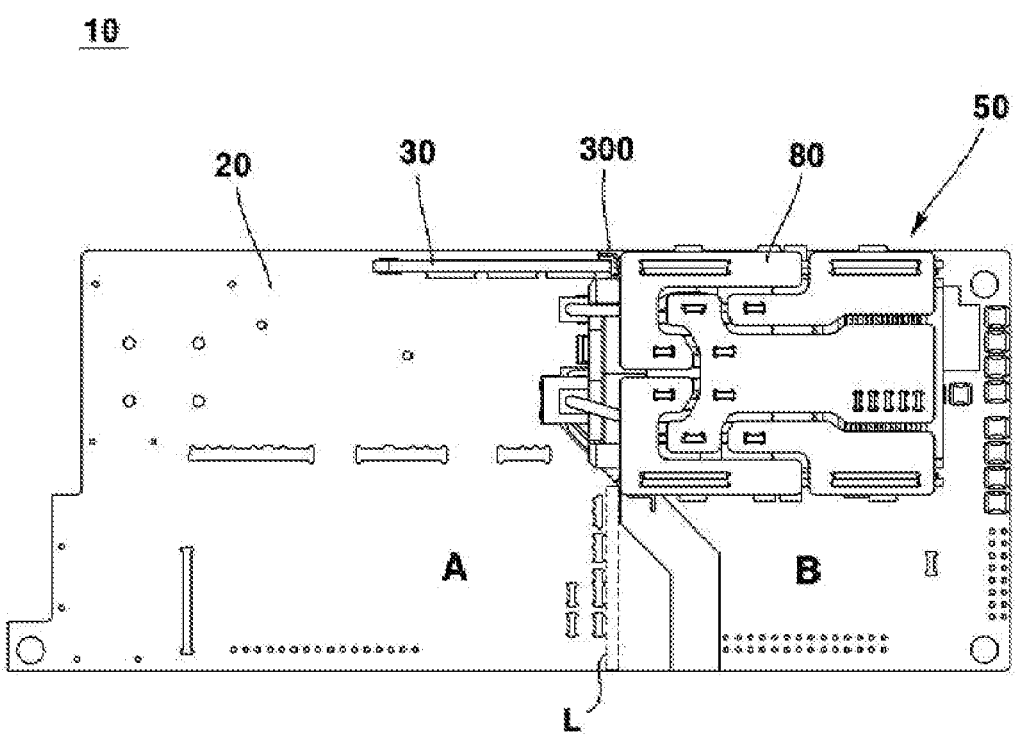
FIG. 2 is a plan view illustrating an upper surface of an electronic component module according to an embodiment of the present invention.
Figure 3:
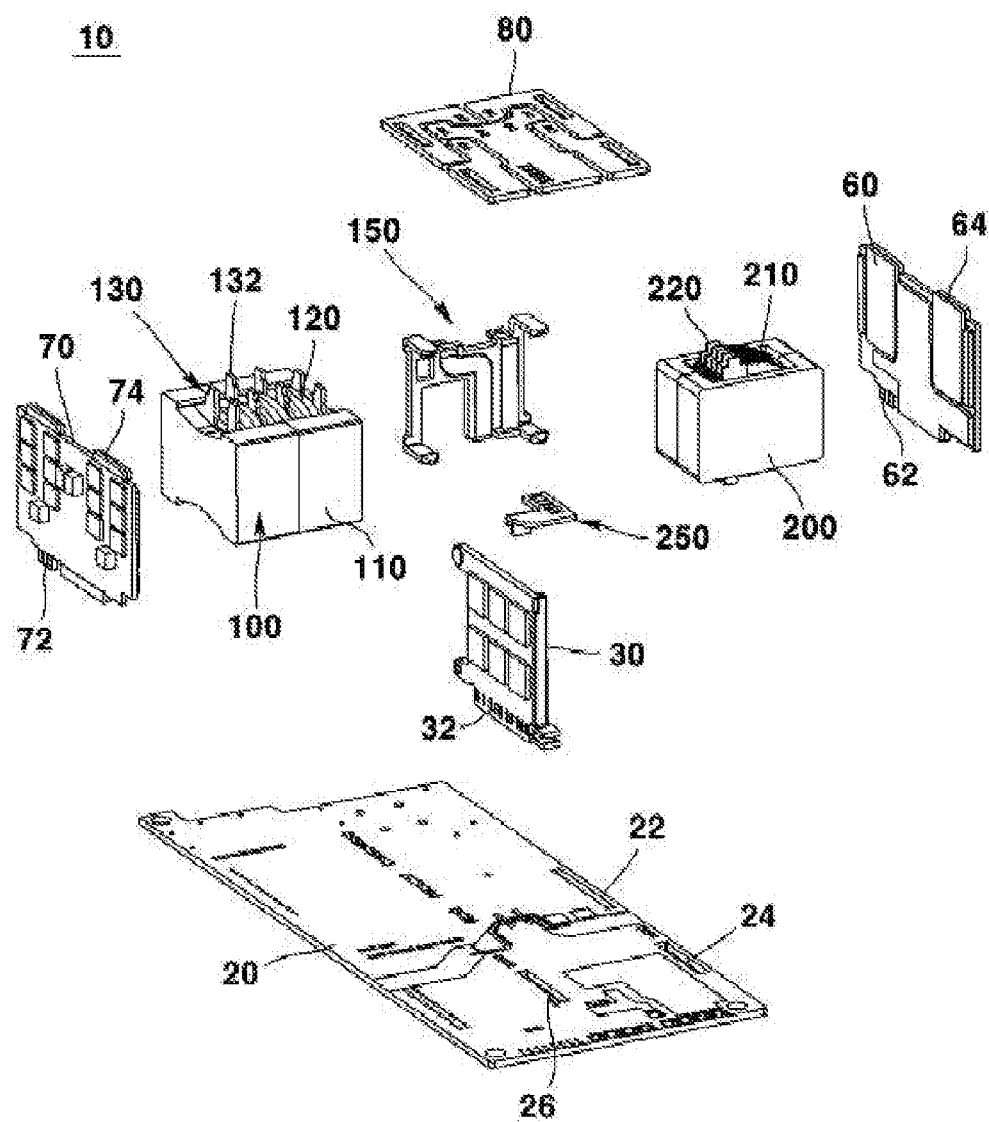
FIG. 3 is an exploded perspective view of an electronic component module according to an embodiment of the present invention.
Figure 4:
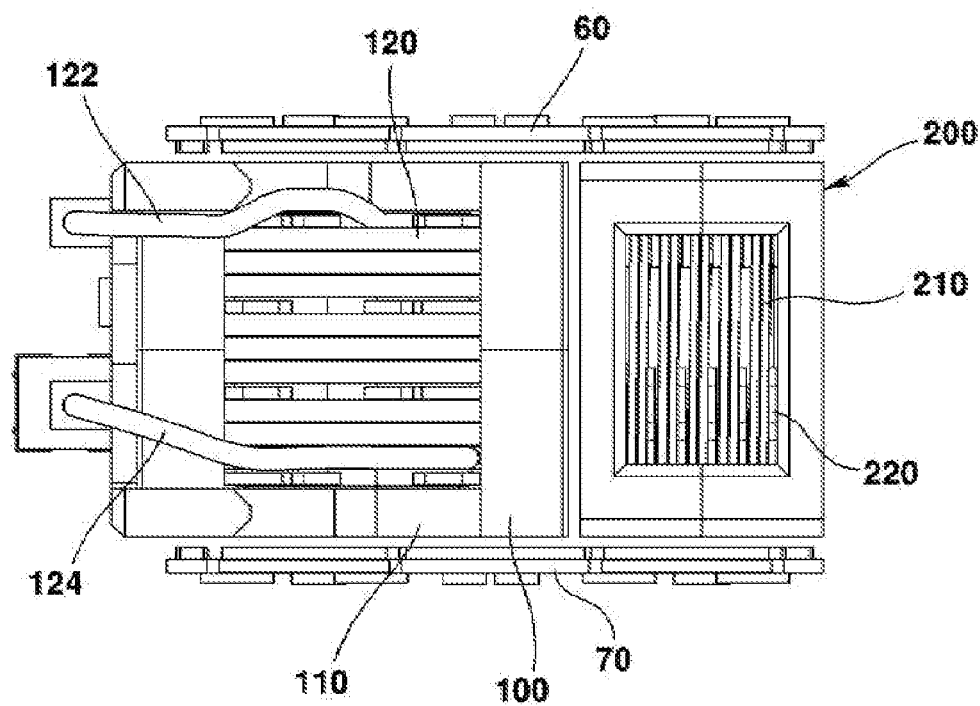
FIG. 4 is a plan view illustrating upper surfaces of a transformer and an inductor according to an embodiment of the present invention.
Figure 5:
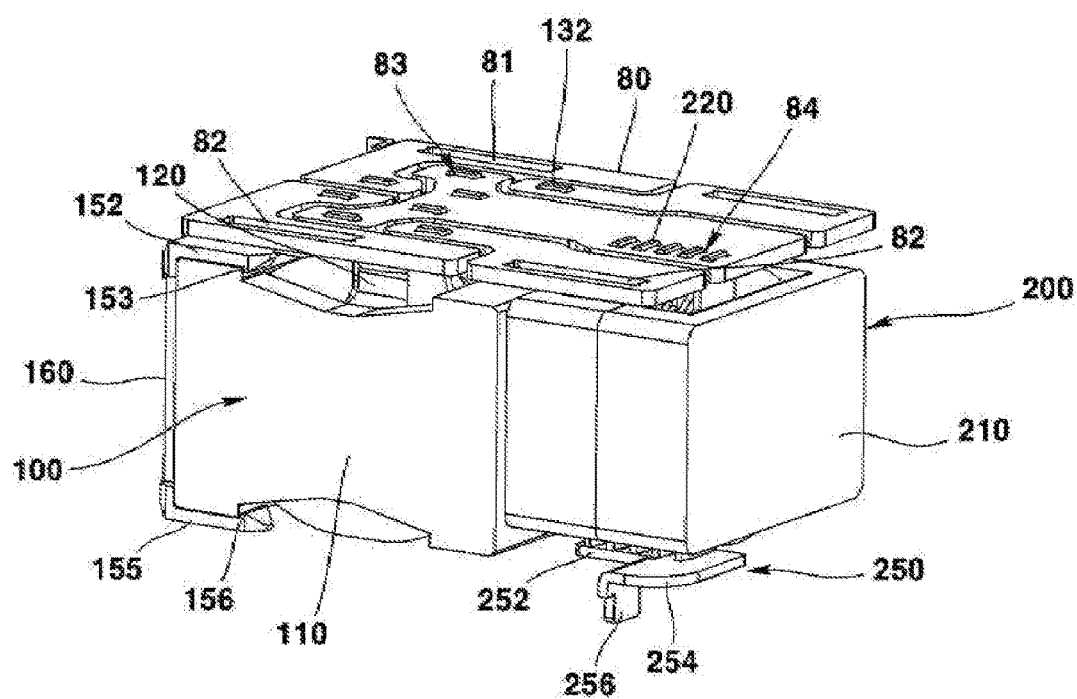
FIG. 5 is a perspective view of an electronic component module excluding a first printed circuit board according to an embodiment of the present invention.
Figure 6:
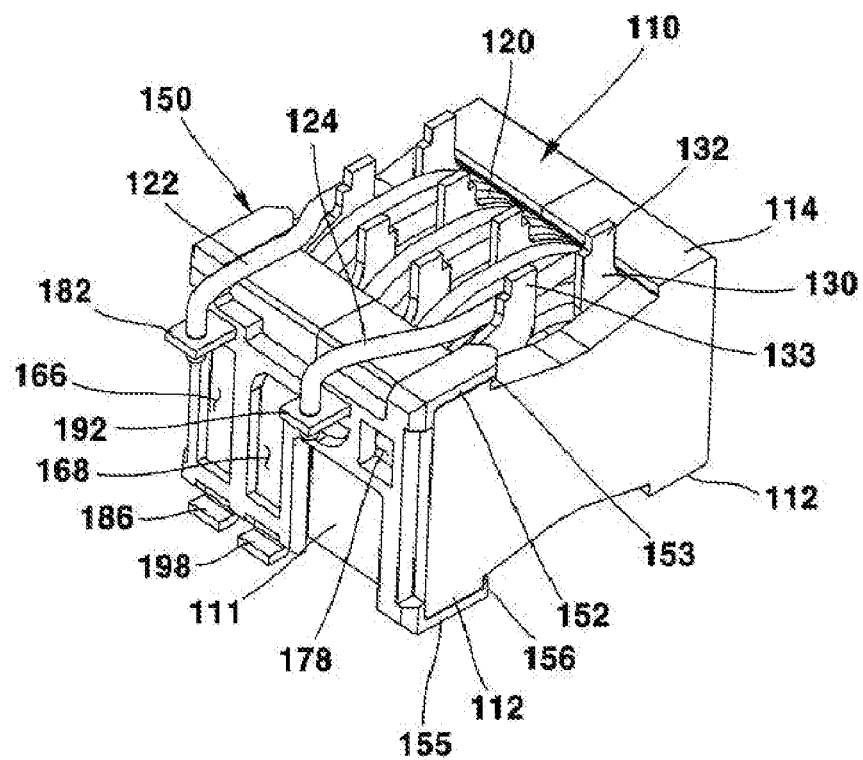
FIG. 6 is a perspective view of a transformer according to an embodiment of the present invention.
Figure 7:
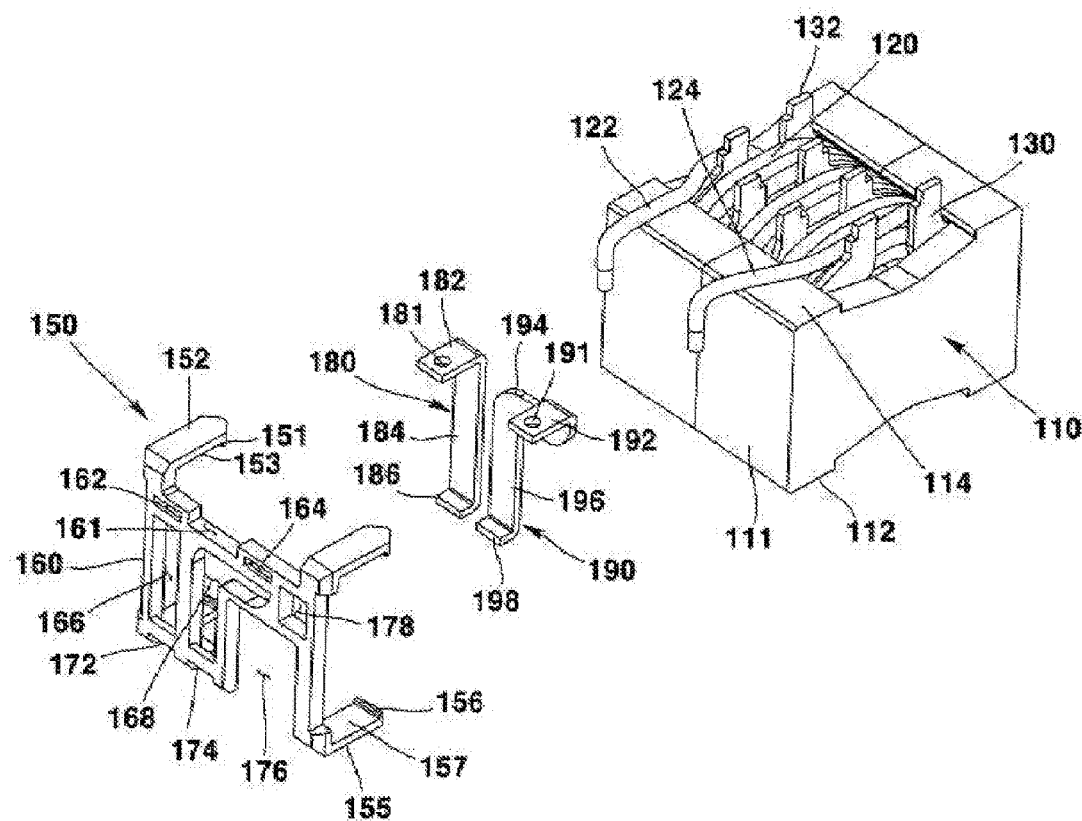
FIG. 7 is an exploded perspective view of a transformer, a busbar, and a bracket according to an embodiment of the present invention.
Figure 8:
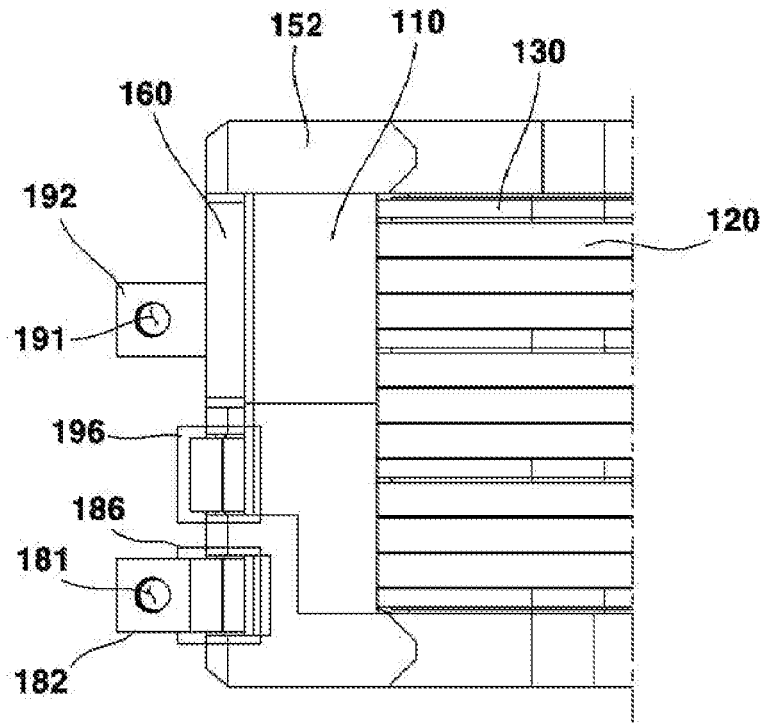
FIG. 8 is a plan view illustrating a part of an upper surface of a transformer according to an embodiment of the present invention.

FIG. 1 is a perspective view of an electronic component module in a power supply device according to an embodiment of the present invention; FIG. 2 is a plan view illustrating an upper surface of an electronic component module according to an embodiment of the present invention; FIG. 3 is an exploded perspective view of an electronic component module according to an embodiment of the present invention; FIG. 4 is a plan view illustrating upper surfaces of a transformer and an inductor according to an embodiment of the present invention; FIG. 5 is a perspective view of an electronic component module excluding a first printed circuit board according to an embodiment of the present invention; FIG. 6 is a perspective view of a transformer according to an embodiment of the present invention; FIG. 7 is an exploded perspective view of a transformer, a busbar, and a bracket according to an embodiment of the present invention; and FIG. 8 is a plan view illustrating a part of an upper surface of a transformer according to an embodiment of the present invention.

Referring to FIGS. 1 to 8, the electronic component module 10 according to an embodiment of the present invention may be disposed inside a power supply device. The outer appearance of the power supply device is formed by housing, and the electronic component module 10 may be disposed inside the housing. A space for disposing the electronic component module 10 may be formed inside the housing.

The electronic component module 10 may comprise: a first printed circuit board 20; a second printed circuit board 80; a third printed circuit board 70; a fourth printed circuit board 60; a fifth printed circuit board 30; a transformer 100; and an inductor 200, but may be implemented except for some of these configurations, and other additional configurations are not excluded.

The first printed circuit board 20 may be referred to as a main board. The second to fifth printed circuit boards 80, 70, 60, and 30 may be referred to as sub-boards.

The first printed circuit board 20 forms a base of the electronic component module 10. One or more electronic components for driving the power supply device may be disposed on the first printed circuit board 20. On the first printed circuit board 20, the second printed circuit board 80, the third printed circuit board 70, the fourth printed circuit board 60, the fifth printed circuit board 30, the transformer 100, and the inductor 200 may be disposed. The first printed circuit board 20 may be electrically connected to the second printed circuit board 80, the third printed circuit board 70, the fourth printed circuit board 60, the fifth printed circuit board 30, the transformer 100, and the inductor 200.

The first printed circuit board 20 may be disposed with: a first hole 26 to which the third printed circuit board 70 is coupled; a second hole 24 to which the fourth printed circuit board 60 is coupled; a third hole 22 to which the fifth printed circuit board 30 is coupled. The first hole 26, the second hole 24, and the third hole 22 may be coupled so as to penetrate through a lower surface from an upper surface of the first printed circuit board 20 so as to correspond to an arrangement region of the third printed circuit board 70, the fourth printed circuit board 60, and the fifth printed circuit board 30.

The second printed circuit board 80 may be disposed at an upper portion of the transformer 100 and the inductor 200. Upper surfaces of the transformer 100 and the inductor 200 may be covered by the second printed circuit board 80. The first printed circuit board 20 and the second printed circuit board 80 may be disposed to face each other with respect to the transformer 100 and the inductor 200. The cross-sectional area of the second printed circuit board 80 may correspond to an arrangement region of the transformer 100 and the inductor 200.

The second printed circuit board 80 may include a fourth hole 82 and a fifth hole 81. The fourth hole 82 is disposed to face the third printed circuit board 70 in an up and down direction, and may be formed to penetrate through a lower surface of the second printed circuit board 80 from an upper surface. The fifth hole 81 is disposed to face the fourth printed circuit board 60 in an up and down direction, and may be formed to penetrate through a lower surface of the second printed circuit board 80 from an upper surface.

The third printed circuit board 70 may be disposed to cover one side surface of the transformer 100 and the inductor 200. The third printed circuit board 70 may be disposed perpendicular to the first printed circuit board 20 and the second printed circuit board 80.

The third printed circuit board 70 may be electrically connected to the first printed circuit board 20 and the second printed circuit board 80. A first coupling portion 72 may be disposed at a lower end of the third printed circuit board 70 to be coupled to the first hole 26. The first coupling portion 72 may be formed to be protruded more downward than other regions. A second coupling portion 74 may be disposed at an upper end of the third printed circuit board 70 to be coupled to the fourth hole 82. The second coupling portion 74 may be formed to be more protruded upward than other regions. A circuit pattern electrically connecting the first printed circuit board 20 and the third printed circuit board 70 to each other may be formed in the first coupling portion 72 and the first hole 26. A circuit pattern electrically connecting the second printed circuit board 80 and the third printed circuit board 70 to each other may be formed in the second coupling portion 74 and the fourth hole 82.

The fourth printed circuit board 60 may be disposed to cover the other side surfaces of the transformer 100 and the inductor 200. The other side surface may face the one side surface. The third printed circuit board 70 and the fourth printed circuit board 60 may be disposed to face each other with respect to the transformer 100 and the inductor 200. The fourth printed circuit board 60 may be disposed perpendicular to the first printed circuit board 20 and the second printed circuit board 80. The fourth printed circuit board 60 may be disposed parallel to the third printed circuit board 70.

The fourth printed circuit board 60 may be electrically connected to the first printed circuit board 20 and the second printed circuit board 80. A third coupling portion 62 may be disposed at a lower end of the fourth printed circuit board 60 to be coupled to the second hole 24. The third coupling portion 62 may be formed to be protruded more downward than other regions. A fourth coupling portion 64 may be disposed at an upper end of the fourth printed circuit board 60 to be coupled to the fifth hole 81. The fourth coupling portion 64 may be disposed to be protruded more upward than other regions. A circuit pattern electrically connecting the first printed circuit board 20 and the fourth printed circuit board 60 to each other may be formed in the third coupling portion 62 and the second hole 24. A circuit pattern electrically connecting the second printed circuit board 80 and the fourth printed circuit board 60 to each other may be formed in the fourth coupling portion 64 and the fifth hole 81.

The fifth printed circuit board 30 may be disposed on the first printed circuit board 20. The fifth printed circuit board 30 may be disposed perpendicular to the first printed circuit board 20. The fifth printed circuit board 30 may be disposed at an edge of the first printed circuit board 20. The fifth printed circuit board 30 may be spaced apart from the fourth printed circuit board 60 by a predetermined distance. A fifth coupling portion 32 being protruded more downward than other regions may be formed at a lower end of the fifth printed circuit board 30. The fifth coupling portion 32 may be coupled to the third hole 22. A circuit pattern electrically connecting the fifth printed circuit board 30 and the first printed circuit board 20 may be formed in the fifth coupling portion 32 and the third hole 22. The coupling structure of the fourth printed circuit board 60 and the fifth printed circuit board 30 on the first printed circuit board 20 will be described later.

The transformer 100 is for voltage conversion in the power supply device and may be disposed between the first printed circuit board 20 and the second printed circuit board 80. The transformer 100 may be electrically connected to the first printed circuit board 20 and the second printed circuit board 80. The lower surface of the transformer 100 may face the upper surface of the first printed circuit board 20 and the upper surface may face the lower surface of the second printed circuit board 80.

The transformer 100 may include a core 110, a first coil 120, and a second coil 130.

The core 110 may be a magnetic material. Upper and lower surfaces of the core 110 may be open. The core 110 may be formed by coupling a plurality of split cores. For example, the plurality of split cores may be mutually coupled in a direction (first direction) in which the third printed circuit board 70 and the fourth printed circuit board 60 face each other. A leg portion (not shown) may be disposed on an inner surface of the plurality of split cores facing each other so that the first coil 120 and the second coil 130 are coupled or wound. The split core may be an E-type core. The leg portion may have a single axial shape by being disposed on each of the plurality of split cores and mutually coupled to each other. The first coil 120 and the second coil 130 may surround the leg portion or may be disposed along the circumference of the leg portion.

Protruded portions 112 and 114 may be disposed on an upper surface and a lower surface of the core 110, respectively, being protruded more upward or downward than other regions. The protruded portion 114 may be provided in plurality on an upper surface of the core 110 and may be disposed to face each other about a region in which the upper surface of the core 110 is open. The protruded portion 112 may be provided in plural on a lower surface of the core 110 and may be disposed to face each other about a region in which the lower surface of the core 110 is opened. The core 110 may have a side surface portion 111 to which a bracket 150, which will be described later, is coupled. The protruded portions 112 and 114 may be respectively disposed at an upper portion and a lower portion of the side surface portion 111.

The first coil 120 may be disposed inside the core 110. The first coil 120 may be wound on the leg portion. The first coil 120 has a first end portion 122 forming one end and a second end portion 124 forming the other end, and the first end portion 122 and the second end portion 124 may be disposed outside the core 110. A region between the first end portion 122 and the second end portion 124 may be wound on the leg portion. The first coil 120 may be a primary side coil.

The second coil 130 may be disposed inside the core 110. The second coil 130 may be coupled to the leg portion. The second coil 130 may be formed in a plate shape. The second coil 130 may be provided in plural and spaced apart from one another. For example, four second coils 130 may be provided and spaced apart from one another along the first direction. A disposition region of the first coil 120 may be divided into a plurality of regions by the second coil 130. A third end portion 132 and a fourth end portion 133 being protruded upward may be disposed at both ends of the second coil 130. The third end portion 132 and the fourth end portion 133 may be referred to as terminal portions.

The third end portion 132 and the fourth end portion 133 may be coupled to the second printed circuit board 80. A coupling hole 83 may be formed in the second printed circuit board 80 so that the third end portion 132 and the fourth end portion 133 are coupled to each other. At least a portion of the third end portion 132 and the fourth end portion 133 of the plurality of second coils 130 may not be overlapped in the first direction. The second coil 130 may be a secondary side coil.

In the present embodiment, it has been described that the first coil 120 is a primary side coil and the second coil 130 is a secondary side coil, but this is not limited, and the second coil 130 is a primary side coil, and the first coil 120 may be a secondary side coil.

Meanwhile, an insulation sheet (not shown), for insulation, may be disposed between the side surface of the second coil 130 and the first coil 120.

The first coil 120 may be coupled to busbars 180 and 190. One ends of the busbars 180 and 190 is coupled to the first coil 120, and the other ends may be coupled to the first printed circuit board 20. The other ends of the busbars 180 and 190 may be soldered on the first printed circuit board 20. The lower surfaces of the other ends of the busbars 180 and 190 may be in contact with the upper surface of the first printed circuit board 20. Unlike this, a hole (not shown) is formed on the first printed circuit board 20 so that the other ends of the busbars 180 and 190 penetrate through, and the other ends of the busbars 180 and 190 may be coupled to penetrate through the hole.

The busbars 180 and 190 may be disposed on the side surface portion 111 of the core 110. The busbars 180 and 190 may be disposed to cover at least a portion of the side surface portion 111. The busbars 180 and 190 may be spaced apart from the side surface portion 111 by a predetermined distance. An insulating sheet or insulating tape for insulation may be disposed between the busbars 180 and 190 and the side surface portion 111.

The busbars 180 and 190 may include a first busbar 180 to which the first end portion 122 is coupled and a second busbar 190 to which the second end portion 124 is coupled.

The first busbar 180 may include a first upper end portion 182, a first lower end portion 186, and a first connection portion 184. The first upper end portion 182 may be disposed parallel to the first printed circuit board 20 or the second printed circuit board 80. A first coupling hole 181 may be formed in the first upper end portion 182 to couple the first end portion 122 thereto. The first coupling hole 181 may be formed to penetrate from an upper surface to a lower surface of the first upper end portion 182. The first end portion 122 may be coupled to penetrate through the first coupling hole 181. The first end portion 122 may be soldered or fused inside the first coupling hole 181.

The first lower end portion 186 may be coupled to the first printed circuit board 20. The first lower end portion 186 may form a lower end of the first busbar 180. The first lower end portion 186 may be disposed parallel to the first printed circuit board 20, the second printed circuit board 80, and the first upper end portion 182. The first lower end portion 186 may be disposed to be overlapped with the first upper end portion 182 in an up and down direction.

The first connection portion 184 may be disposed to connect the first upper end portion 182 and the first lower end portion 186. The first connection portion 184 may be disposed perpendicular to the first printed circuit board 20 or the second printed circuit board 80.

The first busbar 180 may be formed of a metal material, and the first upper end portion 182, the first lower end portion 186, and the first connection portion 184 may be formed as one body.

The second busbar 190 may include a second upper end portion 192, a second lower end portion 198, and second connection portions 194 and 196. The second upper end portion 192 may be disposed parallel to the first printed circuit board 20 or the second printed circuit board 80. A second coupling hole 191 may be formed in the second upper end portion 192 to couple the second end portion 124 thereto. The second coupling hole 191 may be formed to penetrate from an upper surface to a lower surface of the second upper end portion 192. The second end portion 124 may be coupled to penetrate through the second coupling hole 191. The second end portion 124 may be soldered or fused inside the second coupling hole 191.

The second lower end portion 198 may be coupled to the first printed circuit board 20. The second lower end portion 198 may form a lower end of the second busbar 190. The second lower end portion 198 may be disposed parallel to the first printed circuit board 20, the second printed circuit board 80, and the second upper end portion 192. The second lower end portion 198 may be disposed to be overlapped with the second upper end portion 192 in an up and down direction.

The second connection portion may have a region bent at least once. The second connection portion may include a second-first connection portion 194 and a second-second connection portion 196.

The second-first connection portion 194 is bent in a horizontal direction from the lower end of the second upper end portion 192, and the lower end may be connected to the upper end of the second-second connection portion 196. One end of the second-first connection portion 194 is connected to the second upper end portion 192 at a lower end, and the other end of the second-first connection portion 194 may be extended in a horizontal direction to be closer to the first busbar 180. Accordingly, both end portions 122 and 124 of the first coil 120 can be spaced apart by a predetermined distance.

The second-second connection portion 196 may be disposed to connect the second-first connection portion 194 and the second lower end portion 198. The second-second connection portion 196 may be disposed perpendicular to the first printed circuit board 20 or the second printed circuit board 80. The second-second connection portion 196 may be disposed perpendicular to the second upper end portion 192 and the second lower end portion 198. The second-second connection portion 196 may be disposed perpendicular to the second-first connection portion 194. The second-second connection portion 196 may be spaced apart from the first connection portion 184 by a predetermined distance.

The separation distance between the first upper end portion 182 and the second upper end portion 192 may be longer than the separation distance between the first connection portion 184 and the second-second connection portion 196. This is due to the arrangement structure of the second connection portion 192 described above, and through the shape of the busbars 180 and 190, a sufficient separation distance between both end portions of the first coil 120 can be secured in the coupling region with the first coil 120, and by having a relatively small arrangement region on the second printed circuit board 80, a wider component arrangement space can be secured on the second printed circuit board 80.

A bracket 150 supporting the busbars 180 and 190 on an outer surface of the core 110 may be disposed on one side of the transformer 100. Through the bracket 150, the busbars 180 and 190 may be firmly fixed to the outside of the side surface portion 111 of the core 110. The bracket 150 may be made of plastic.

The bracket 150 may include an upper surface portion 152, a lower surface portion 155, and a side surface portion 160.

The upper surface portion 152 is bent inward from an upper end of the side surface portion 160 and may be coupled to the core 110. The upper surface portion 152 may be provided in plurality and spaced apart from each other. The upper surface portion 152 and the lower surface portion 155 may be respectively disposed in four corner regions of the side surface portion 160. A lower surface of the upper surface portion 152 may be in contact with an upper surface of the core 110. A lower surface of the upper surface portion 152 may be in contact with an upper surface of the protruded portion 114. A rib 151 being protruded downward may be formed on a lower surface of the upper surface portion 152. The rib 151 may be disposed at a lower end of the upper surface portion 152 being extended outward. A side surface of the rib 151 may be in contact with a side surface of the protruded portion 114. That is, the upper surface portion 152 may be hook-coupled to the core 110 through the rib 151.

The lower surface portion 155 may be bent inward from a lower end of the side surface portion 160 and coupled to the core 110. The lower surface portion 155 may be provided in plurality and spaced apart from one another. An upper surface of the lower surface portion 155 may be in contact with a lower surface of the core 110. An upper surface of the lower surface portion 155 may be in contact with a lower surface of the protruded portion 112. A rib 156 being protruded upward may be formed on an upper surface of the lower surface portion 155. The rib 156 may be disposed on an upper end of the lower surface portion 155 being extended outward. A side surface of the rib 156 may be in contact with a side surface of the protruded portion 112. The lower surface portion 155 may be hook-coupled to the core 110 through the rib 156.

In summary, the upper surface portion 152 and the lower surface portion 155 cover upper and lower surfaces of the core 110 and may be hook-coupled to the protruded portions 112 and 114.

The side surface portion 160 may include a first through hole 162, a second through hole 164, a third through hole 166, and a fourth through hole 168. The first to fourth through holes 162, 164, 166, and 168 may be formed to penetrate from an inner surface to an outer surface of the side surface portion 160.

The first through hole 162 is formed in a region facing the first upper end portion 182 and may penetrate through the first upper end portion 182. A portion of the first upper end portion 182 penetrating through the first through hole 162 may be disposed outside the bracket 150. The cross-sectional area of the first through hole 162 may be larger than the cross-sectional area of the first upper end portion 182. The length of the first through hole 162 in an up and down direction may be longer than the thickness of the first upper end portion 182 in an up and down direction. Accordingly, a sufficient moving space of the first busbar 180 can be secured.

The second through hole 164 is formed in a region facing the second upper end portion 192 and may penetrate through the second upper end portion 192. A portion of the second upper end portion 192 may penetrate through the second through hole 164 and may be disposed outside the bracket 150. The cross-sectional area of the second through hole 164 may be formed to be larger than the cross-sectional area of the second upper end portion 192. The length of the second through hole 164 in an up and down direction may be longer than the thickness of the second upper end portion 192 in an up and down direction. Accordingly, a sufficient moving space of the second busbar 190 can be secured.

A first separation groove 161 may be disposed between a region where the first through hole 162 is formed and a region where the second through hole 164 is formed among the upper end of the side surface portion 160.

The third through hole 166 is formed in a region facing the first connection portion 184 and may expose the first connection portion 184 to the outside. The third through hole 166 may be disposed below the first through hole 162. At least a portion of the first connection portion 184 may be exposed to the outside of the bracket 150 through the third through hole 166.

The fourth through hole 168 is formed in a region facing the second-first connection portion 194 and the second-second connection portion 196, and the second-first connection portion 194 and the second-second connection portion 196 may be exposed to the outside. At least a portion of the fourth through hole 168 may be disposed below the second through hole 164. At least a portion of the second-first connection portion 194 and the second-second connection portion 196 may be exposed to the outside of the bracket 150 through the fourth through hole 168.

At the lower end of the side surface portion 160, a first guide groove 172 and a second guide groove 174 may be disposed, which are formed by being recessed more upwards than other regions. The first lower end portion 186 may be coupled to the first guide groove 172. At least a portion of the first lower end portion 186 may be protruded outward from the bracket 150 penetrating through the first guide groove 172. The length of the first guide groove 172 in a first direction may be formed to correspond to or be longer than the length of the first lower end portion 186 in a first direction.

The second lower end portion 198 may be coupled to the second guide groove 174. At least a portion of the second lower end portion 198 may be protruded outward from the bracket 150 penetrating through the second guide groove 174. The length of the second guide groove 174 in a first direction may be formed to correspond to or be longer than the length of the second lower end portion 198 in a first direction.

Corresponding to the arrangement structure of the busbars 180 and 190, the separation distance between the first through hole 162 and the second through hole 164, may be formed to be longer than the separation distance between the first guide groove 172 and the second guide groove 174.

At least one hole through which the side surface of the core 110 is exposed may be formed in the side surface portion 160. For example, a first exposure hole 178 and a second exposure hole 176 may be formed in the side surface portion 160. The second exposure hole 176 may be disposed below the first exposure hole 178. At least a portion of the side surface portion 111 of the core 110 may be exposed to the outside through the first exposure hole 178 and the second exposure hole 176. Accordingly, heat dissipation efficiency of the transformer 100 can be enhanced.

According to the above structure, there are advantages in that the first coil and the first printed circuit board can be easily coupled through the busbar, and the busbar can be compactly coupled to the outer surface of the transformer through the bracket.

Figure 9:
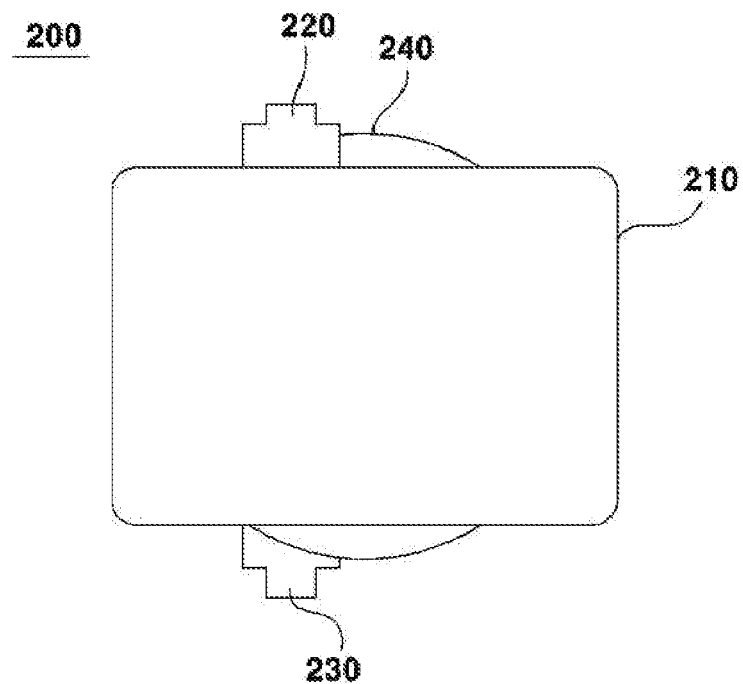
FIG. 9 is a plan view illustrating a side surface of an inductor according to an embodiment of the present invention.
Figure 10:
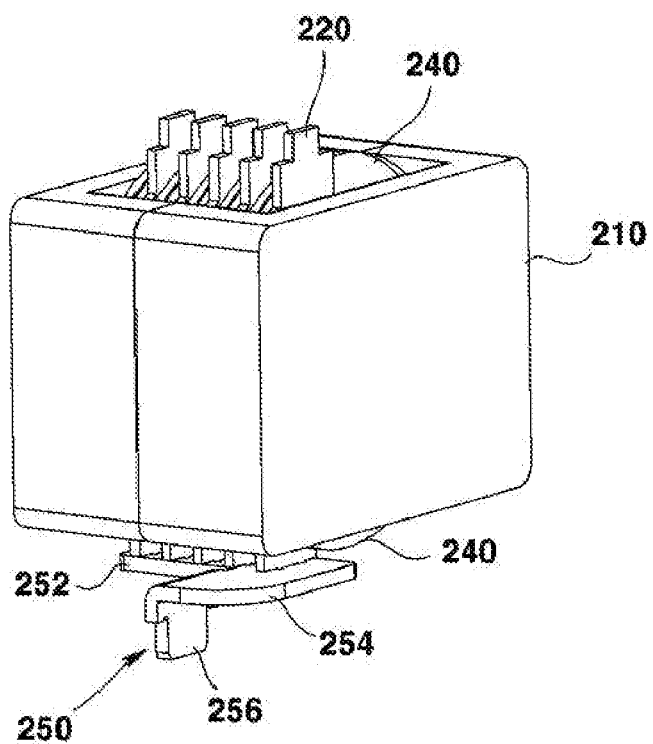
FIG. 10 is a perspective view illustrating the coupling of an inductor and a busbar according to an embodiment of the present invention.

FIG. 9 is a plan view illustrating a side surface of an inductor according to an embodiment of the present invention; and FIG. 10 is a perspective view illustrating the coupling of an inductor and a busbar according to an embodiment of the present invention.

Referring to FIGS. 3, 5, 9 and 10, the inductor 200 may be disposed on one side of the transformer 100. The inductor 200 is for obtaining inductance in the power supply device and may be disposed between the first printed circuit board 20 and the second printed circuit board 80. The inductor 200 may be electrically connected to the first printed circuit board 20 and the second printed circuit board 80. A lower surface of the inductor 200 may face an upper surface of the first printed circuit board 20 and an upper surface may face a lower surface of the second printed circuit board 80. The inductor 200 may be spaced apart from the transformer 100 by a predetermined distance in a horizontal direction.

The inductor 200 may include a core 210 and a coil 240.

The core 210 has the characteristics of a magnetic circuit and can serve as a passage for magnetic flux. The core 210 may be formed by coupling a plurality of split cores. Each split core may be composed of an E-type or I-type core. When the split core is an E-shaped core, it may be disposed in a left-right symmetrical shape. The core 210 may include a magnetic material. The leg portion may be formed on an inner surface of the split core so that the coil 240 is coupled thereto. The leg portion may have a single axial shape by being disposed on each of the plurality of split cores and mutually coupled to each other. The coil 240 may surround the leg portion or may be disposed along the circumference of the leg portion.

The coil 240 may be formed of a conductive metal. The coil 240 may be formed in a form in which a metal wire is wound or in a plate shape. The coils 240 may be provided in plural and spaced apart from one another in a second direction perpendicular to the first direction. An insulating plate for insulation may be disposed among the plurality of coils 240, or an insulating material may be coated on surfaces of adjacent coils 240.

The winding direction of the coil 240 inside the inductor 200 may be perpendicular to a winding direction of the first coil 120 inside the transformer 100.

Each coil 240 may include terminals 220 and 230 electrically connected to the first printed circuit board 20 and the second printed circuit board 80. The terminals 220 and 230 may be formed by both ends of a metal wire. The terminals 220 and 230 may include a first terminal 220 being protruded upward from the core 210 and a second terminal 230 being protruded downward from the core 210. The first terminal 220 and the second terminal 230 may be vertically disposed with respect to the first printed circuit board 20 or the second printed circuit board 80. The first terminal 220 and the second terminal 230 may be disposed symmetrically with respect to the core 210. A coupling hole 84 may be formed on the second printed circuit board 80 so that the first terminal 220 is coupled thereto. Accordingly, the coil 240 may be electrically connected to the second printed circuit board 80.

The second terminal 230 may be coupled to the busbar 250. The coil 240 may be electrically connected to the first printed circuit board 20 through the busbar 250.

The busbar 250 may include upper end portions 252 and 254 and a lower end portion 256 being bent downward from an end portion of the upper end portions 252 and 254. The upper end portions 252 and 254 and the lower end portion 256 are made of a metal material and may be formed as one body.

The upper end portions 252 and 254 may include a first upper end portion 252 and a second upper end portion 254. The upper end portions 252 and 254 may have a semicircular cross-section. The first upper end portion 252 and the second upper end portion 254 may have regions at least partially parallel to each other. The first upper end portion 252 and the second upper end portion 254 may have regions spaced apart in a horizontal direction. At least a portion of the second upper end portion 254 may have a region that is not overlapped with the core 200 in an up and down direction.

A coupling hole may be formed in the first upper end portion 252 so that the second terminal 230 is coupled thereto. A plurality of coupling holes may be disposed corresponding to the number of the coils 240 and the second terminals 230. The second terminal 230 may be inserted into the coupling hole. By coupling the second terminal 230, the busbar 250 may be electrically connected to the coil 240.

The lower end portion 256 is bent downward from the end portion of the second upper end portion 254 and may be disposed perpendicular to the upper end portions 252 and 254. The lower end portion 256 may be protruded downward from lower surfaces of the upper end portions 252 and 254. The lower end portion 256 may be coupled to a coupling hole in the first printed circuit board 20. Accordingly, the busbar 250 may be electrically connected to the first printed circuit board 20.

According to the above structure, there is an advantage in that since the inductor 200 forms a coupling structure with a plurality of printed circuit boards 20 and 80 through a single busbar 250 being disposed only at the bottom, a wide space can be secured inside the housing.

In addition, there is an advantage in that since the busbar disposed in the horizontal direction of the core 210 is omitted, a large arrangement region can be secured for the core 210, thereby increasing the volume ratio of the coil inside the core 210.

Furthermore, there is an advantage in that since the length of the busbar for electrical connection can be relatively reduced, power efficiency can be improved.

Figure 11:
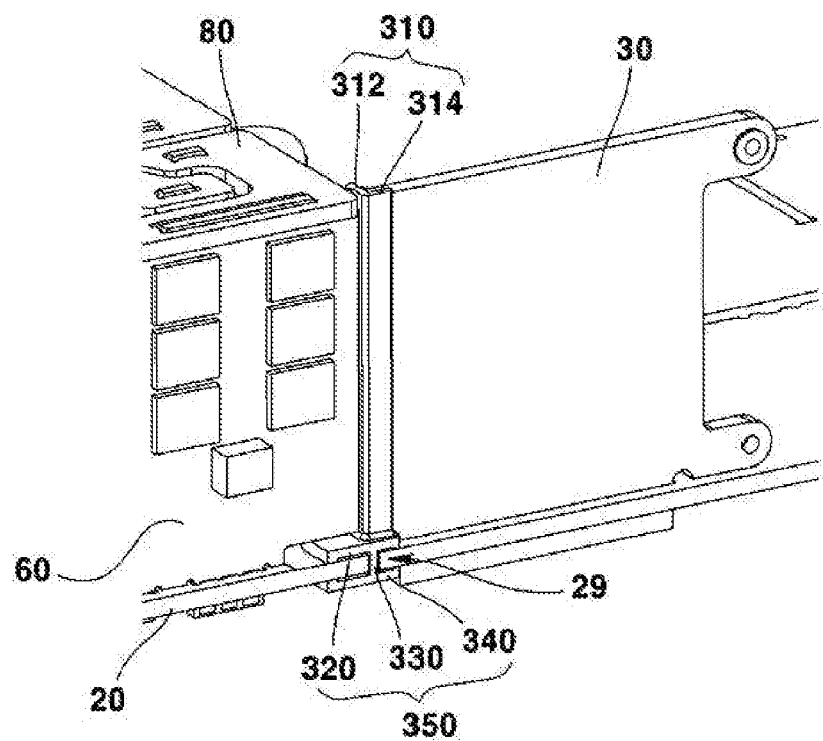
FIG. 11 is a perspective view illustrating the coupling of a fourth printed circuit board and a fifth printed circuit board on a first printed circuit board according to an embodiment of the present invention.
Figure 12:
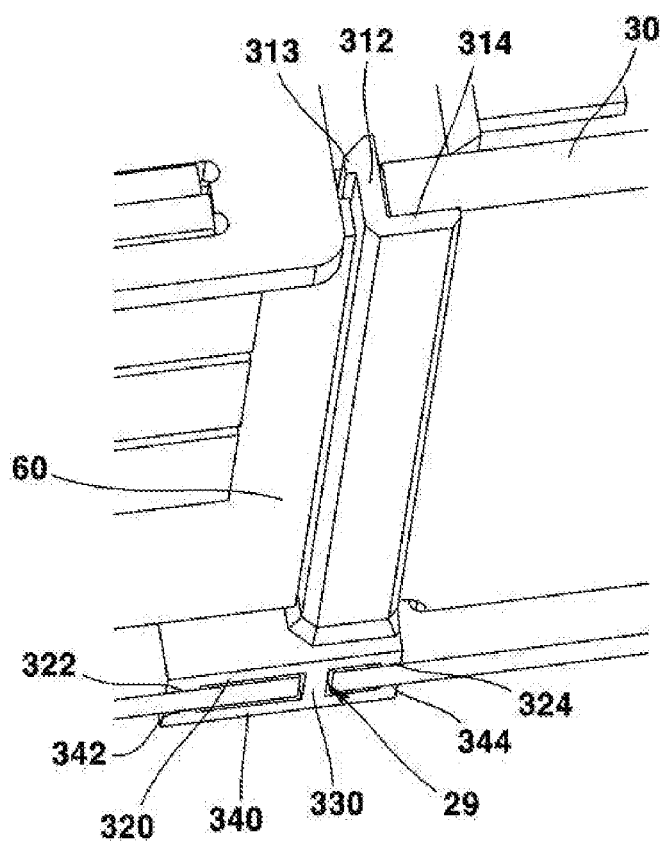
FIG. 12 is a perspective view of a part of FIG. 11 viewed from above.
Figure 13:
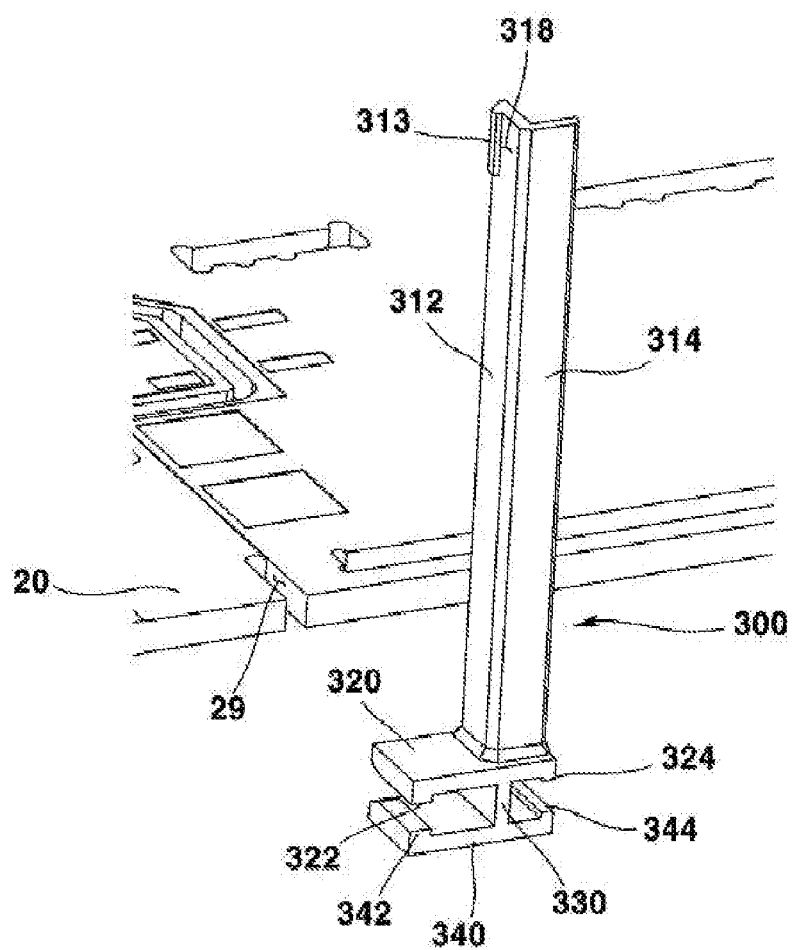
FIG. 13 is an exploded perspective view of a first printed circuit board and a support according to an embodiment of the present invention.

FIG. 11 is a perspective view illustrating the coupling of a fourth printed circuit board and a fifth printed circuit board on a first printed circuit board according to an embodiment of the present invention; FIG. 12 is a perspective view of a part of FIG. 11 viewed from above; and FIG. 13 is an exploded perspective view of a first printed circuit board and a support according to an embodiment of the present invention.

Referring to FIGS. 1 to 3 and 11 to 13, the electronic component module 10 may have a plurality of regions having different functions. For example, a first region A having a first function and a second region B having a second function may be included on the first printed circuit board 20. Electronic components for a first function are disposed in the first region A, and electronic components (for example, the transformer 100 and the inductor 200) for a second function may be disposed in the second region B. The first function and the second function are electrical and circuit functions, for example, the electronic component module 10 converts the voltage of a first magnitude transferred from the first region A into a voltage of a second magnitude in the second region B, or may convert the voltage of a second magnitude transferred from the second region B into a voltage of a first magnitude in the first region A.

Accordingly, the fifth printed circuit board 30 being disposed in the first region A is operated as a first function, and the fourth printed circuit board 60 being disposed in the second region B may be operated as a second function.

Referring to FIG. 2, the first region A and the second region B may be partitioned by an imaginary line L. Since electrical functions are different from each other, a shield (not shown) may be disposed on the imaginary line L in order to prevent noise generation between the first region A and the second region B. The shielding portion is formed in a metal plate shape and may partition the first region A and the second region B from each other. The shielding portion may be disposed perpendicular to the first printed circuit board 20.

In order to mutually insulate the fourth printed circuit board 60 and the fifth printed circuit board 30, which are bonded to the shield or disposed adjacent to each other, the electronic component module may include a supporter 300. The supporter 300 may be coupled to the first printed circuit board 20 and disposed between the fourth printed circuit board 60 and the fifth printed circuit board 30. The supporter 300 may be formed of plastic or resin material.

In detail, the supporter 300 may include a first body 310 and a second body 350.

The first body 310 may be disposed between the fourth printed circuit board 60 and the fifth printed circuit board 30. The length of the first body 310 in an up and down direction is formed to correspond to the length of the fourth printed circuit board 60 or the fifth printed circuit board 30 in an up and down direction or may be formed to be longer than that. The first body 310 may be formed to be protruded upward from the upper surface of the second body 350. The first body 310 may have a bar shape. The first body 310 may have an approximately letter "L" shape in cross section.

The first body 310 may include a first plate portion 312 and a second plate portion 314. The first plate portion 312 and the second plate portion 314 may be disposed perpendicular to each other. The first plate portion 312 may have one side surface facing the side surface of the fourth printed circuit board 60 and the other side surface facing the side surface of the fifth printed circuit board 30. Both side surfaces of the first plate portion 312 may be in contact with the side surfaces of the fourth printed circuit board 60 and the side surfaces of the fifth printed circuit board 30, respectively, or may be disposed spaced apart from each other.

A guide rib 313 being protruded outward may be formed on one side surface of the first plate portion 312 facing the fourth printed circuit board 60. The guide rib 313 may be disposed adjacent to an upper end of the first plate portion 312. An outer surface of the guide rib 313 may face an inner surface of the fourth printed circuit board 60. An outer surface of the guide rib 313 may be in contact with an inner surface of the fourth printed circuit board 60. A guide groove 318 being coupled to a side surface of the fourth printed circuit board 60 may be formed inside the guide rib 313 by the guide rib 313. Accordingly, the inner and outer surfaces of the fourth printed circuit board 60 may be supported by the inner surface of the housing and the guide ribs 313.

The second plate portion 314 is disposed outside the first plate portion 312 and may support the outer surface of the fifth printed circuit board 30. It may also be understood that the second plate portion 314 is protruded from the other side surface of the first plate portion 312 facing the fifth printed circuit board 30. The second plate portion 314 may be in contact with an outer surface of the fifth printed circuit board 30. The outer surface of the fifth printed circuit board 30 is supported by the inner surface of the second plate portion 314, and a side surface of the fifth printed circuit board 30 may be supported by the other side surface of the first plate portion 312. The length of the first plate portion 312 being protruded from an inner surface of the second plate portion 314 may be formed to be longer than the thickness of the fourth printed circuit board 60 or the fifth printed circuit board 30.

The second body 350 may be disposed below the first body 310. The second body 350 may form a lower end of the supporter 300. The second body 350 may be coupled to the first printed circuit board 20. A portion of the side surface of the first printed circuit board 20 may be cut inward to include a coupling groove 29 for coupling the second body 350 thereto. The coupling groove 29 may be disposed to be overlapped with a portion of the virtual line L and the arrangement region of the shielding portion. The coupling groove 29 may have a hole shape penetrating the lower surface from the upper surface of the first printed circuit board 20.

The second body 350 may include an upper plate 320, a lower plate 340, and a side plate 330.

The upper plate 320 may be disposed on the first printed circuit board 20. An upper surface of the upper plate 320 may support a lower end of the first body 310. A portion of the upper surface of the upper plate 320 may be in contact with a lower surface of the fourth printed circuit board 60. The coupling groove 29 may be formed in a way that with respect to the side plate 330, the length of the second body 350 being disposed in the second region B is to be longer than the length of the second body 350 being disposed in the first region A.

First ribs 322 and 324 being protruded downward may be disposed on a lower surface of the upper plate 320. Lower surfaces of the first ribs 322 and 324 may be in contact with an upper surface of the first printed circuit board 20. A portion of a lower surface of the upper plate 320 may be spaced apart from an upper surface of the first printed circuit board 20 by a predetermined distance through the first ribs 322 and 324. The plurality of first ribs 322 and 324 may be disposed on both edges of the lower surface of the upper plate 320.

The lower plate 340 may be disposed below the first printed circuit board 20. An upper surface of the lower plate 340 may be disposed to face a lower surface of the first printed circuit board 20. The lower plate 340 may be disposed to face the upper plate 320.

Second ribs 342 and 344 being protruded upward may be disposed on an upper surface of the lower plate 340. Upper surfaces of the second ribs 342 and 344 may be in contact with a lower surface of the first printed circuit board 20. A portion of an upper surface of the lower plate 340 may be spaced apart from a lower surface of the first printed circuit board 20 by a predetermined distance through the second ribs 342 and 344. A plurality of second ribs 342 and 344 may be disposed at both edges of an upper surface of the lower plate 340. The second ribs 342 and 344 of the lower plate 340 and the first ribs 322 and 324 of the upper plate 320 may be disposed symmetrically with each other.

The distance between the first ribs 322 and 324 and the second ribs 342 and 344 in an up and down direction may correspond to the thickness of the first printed circuit board 20 in an up and down direction.

The side plate 330 may be disposed to connect the upper plate 320 and the lower plate 340. The side plate 330 may be disposed perpendicular to the upper plate 320 and the lower plate 340. The side plate 330 may be disposed to penetrate through the coupling groove 29. The length of the side plate 330 in an up and down direction may be longer than the thickness of the first printed circuit board 20 in an up and down direction. A side surface of the first printed circuit board 20 and an outer surface of the side plate 330 may form the same plane. The second body 350 may be coupled to the first printed circuit board 20 through the sliding movement of the side plate 330 inside the coupling groove 29. To facilitate the sliding movement, at least a portion of an upper surface of the ribs 322, 324, 342, and 344 of the upper plate 320 and the lower plate 340 may be formed with an inclined surface having a height different from that of other regions.

According to the above structure, there is an advantage in that it is possible to insulate between pluralities of printed circuit boards being disposed adjacent to each other through the supporter, thereby possibly securing a wider component arrangement space on the main printed circuit board.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. An electronic component module comprising:
   a first printed circuit board;
   a transformer being disposed on the first printed circuit board and including a first core and a first coil being disposed inside the first core;
   a second printed circuit board being disposed on the transformer;
   a busbar being disposed outside the first core and coupled to both ends of the first coil; and
   a bracket being disposed outside the busbar and coupled to the first core,
   wherein the first coil includes a first end portion and a second end portion,
   wherein the busbar includes a first busbar being coupled to the first end portion and a second busbar being coupled to the second end portion,
   wherein the first busbar includes:
      a first upper end portion including a first coupling hole to which the first end portion is coupled;
      a first lower end portion being coupled to the first printed circuit board; and
      a first connection portion connecting the first upper end portion and the first lower end portion,
   wherein the second busbar includes:
      a second upper end portion including a second coupling hole to which the second end portion is coupled;
      a second lower end portion being coupled to the first printed circuit board; and
      a second connection portion connecting the second upper end portion and the second lower end portion, and
      wherein the second connection portion has a region bent at least once.

2. The electronic component module according to claim 1, wherein the distance between the first upper end portion and the second upper end portion is longer than a distance between the first lower end portion and the second lower end portion.

3. The electronic component module according to claim 1, wherein the bracket includes:

an upper surface portion disposed above the first core;
a lower surface portion of the first core is disposed; and
a side surface portion being disposed on a side surface of the first core, and
wherein a first through hole and a second through hole are disposed in the side surface portion to allow the first upper end portion and the second upper end portion to penetrate therethrough.

4. The electronic component module of claim 1, wherein the first coil includes a primary coil and a secondary coil, and
wherein the primary coil and the secondary coil are alternately disposed within the first core.

5. The electronic component module according to claim 3, wherein a third through hole and a fourth through hole penetrating an inner surface from an outer surface are disposed on the side surface portion, corresponding to the disposed regions of the first side surface portion and the second side surface portion.

6. The electronic component module according to claim 3,
wherein a first protruded portion being protruded more upward than the other regions is disposed on an upper surface of the first core,
wherein a second protruded portion being protruded more downward than the other regions is disposed on a lower surface of the first core, and
wherein the upper surface portion and the lower surface portion are respectively hook-coupled to the first protruded portion and the second protruded portion.

7. The electronic component module according to claim 3,
wherein at a lower end of the side surface portion, a first guide groove, being formed to be more recessed than other regions, to which the first lower end portion is coupled, and a second guide groove to which the second lower end portion is coupled are disposed.

8. The electronic component module according to claim 3,
wherein the side surface portion includes at least one or more exposure hole exposing a side surface of the first core to the outside.

9. An electronic component module comprising:
a first printed circuit board;
a transformer being disposed on the first printed circuit board and including a first core and a first coil being disposed inside the first core;
a second printed circuit board being disposed on the transformer;
a busbar being disposed outside the first core and coupled to both ends of the first coil;
a bracket being disposed outside the busbar and coupled to the first core; and
an inductor disposed on the first printed circuit board and comprising a second core, and a second coil disposed in the second core.

10. The electronic component module of claim 9, comprising a metal plate disposed on the inductor and the transformer.

11. The electronic component module of claim 9, wherein a winding direction of the first coil is perpendicular to that of the second coil.

12. The electronic component module of claim 10, wherein the second coil comprises a first terminal protruding upward from the second core, and a second terminal protruding downward from the second core,
wherein the first terminal is coupled to the metal plate, and
wherein the second terminal is coupled to the busbar.

13. The electronic component module of claim 12, wherein the metal plate includes a first coupling hole to which the first terminal is coupled.

14. A power supply device comprising:
an electronic component module,
wherein the electronic component module comprises:
a first printed circuit board;
a transformer being disposed on the first printed circuit board and including a first core and a first coil being disposed inside the first core;
a second printed circuit board being disposed on the transformer;
a busbar being disposed outside the first core and coupled to both ends of the first coil; and
a bracket being disposed outside the busbar and coupled to the first core,
wherein the first coil includes a first end portion and a second end portion,
wherein the busbar includes a first busbar being coupled to the first end portion and a second busbar being coupled to the second end portion,
wherein the first busbar includes:
a first upper end portion including a first coupling hole to which the first end portion is coupled;
a first lower end portion being coupled to the first printed circuit board; and
a first connection portion connecting the first upper end portion and the first lower end portion,
wherein the second busbar includes:
a second upper end portion including a second coupling hole to which the second end portion is coupled;
a second lower end portion being coupled to the first printed circuit board; and
a second connection portion connecting the second upper end portion and the second lower end portion, and
wherein the second connection portion has a region bent at least once.

15. The power supply device of claim 14, wherein the distance between the first upper end portion and the second upper end portion is longer than a distance between the first lower end portion and the second lower end portion.

16. The power supply device of claim 14, wherein the bracket includes:
an upper surface portion disposed above the first core;
a lower surface portion of the first core is disposed; and
a side surface portion being disposed on a side surface of the first core, and
wherein a first through hole and a second through hole are disposed in the side surface portion to allow the first upper end portion and the second upper end portion to penetrate therethrough.

* * * * *